(12) United States Patent
Choi (10) Patent No.: US 11,398,796 B1
(45) Date of Patent: Jul. 26, 2022

(54) TEMPERATURE COMPENSATED OSCILLATORS AND ASSOCIATED METHODS

(71) Applicant: Micron Technology, Inc., Boise, ID (US)

(72) Inventor: Jung-Hwa Choi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/158,920

(22) Filed: Jan. 26, 2021

(51) Int. Cl.
*H03B 5/04* (2006.01)
*H03B 5/24* (2006.01)

(52) U.S. Cl.
CPC ............. *H03B 5/04* (2013.01); *H03B 5/24* (2013.01)

(58) Field of Classification Search
CPC .................................................. H03B 5/04
USPC .................................................. 331/117 R
See application file for complete search history.

(56) References Cited

U.S. PATENT DOCUMENTS

| | | | | |
|---|---|---|---|---|
| 6,175,284 B1* | 1/2001 | Sakurai | ............ | H03L 1/00 331/116 FE |
| 6,522,208 B1* | 2/2003 | Knowles | ............ | H03K 3/0315 331/175 |
| 2002/0000889 A1* | 1/2002 | Kim | ............ | H03B 5/04 331/143 |
| 2004/0036545 A1* | 2/2004 | Chung | ............ | H03B 5/04 331/135 |
| 2006/0181359 A1* | 8/2006 | Park | ............ | H03K 3/353 331/135 |

* cited by examiner

*Primary Examiner* — Joseph Chang
(74) *Attorney, Agent, or Firm* — Perkins Coie LLP (57) ABSTRACT

Temperature compensated oscillators and associated methods are disclosed. The oscillator may include an inverter with a variable load configured to provide different conductance values based on an operating temperature of the oscillator. The variable load includes two or more branches in parallel, where each branch has a unique conductance value different from each other. Further, the variable load is coupled to a temperature sensor that generates signals based on determining the operating temperature. The signals of the temperature sensor can activate one or more branches of the variable load. As a result, the inverter may trigger at different voltage levels such that variations in the frequency of the clock signal that the oscillator generates can be reduced across different operating temperatures.

19 Claims, 7 Drawing Sheets

*Figure 5*

TEMPERATURE COMPENSATED OSCILLATORS AND ASSOCIATED METHODS

TECHNICAL FIELD

The present disclosure generally relates to semiconductor devices, and more particularly relates to temperature compensated oscillators and associated methods.

BACKGROUND

Semiconductor devices are widely used to process and/or store information related to various electronic devices such as computers, wireless communication devices, cameras, digital displays, and the like. Information is stored by programing different states of a memory cell. Various types of semiconductor memory devices exist, such as non-volatile memory devices (e.g., NOR flash memory devices, 3-dimensional NAND flash memory devices, etc.) and volatile memory devices (e.g., dynamic RAM (DRAM), synchronous dynamic RAM (SDRAM), etc.).

Improving memory devices, generally, may include increasing memory cell density, increasing read/write speeds or otherwise reducing operational latency, increasing reliability, increasing data retention, reducing power consumption, reducing areas occupied by integrated circuitry, or reducing manufacturing costs, among other metrics. One way of reducing manufacturing costs is to improve manufacturing processes to increase the margin of successfully manufactured devices. Manufacturers can improve the manufacturing margin by implementing processes that, for example, increase the consistency or tolerance of manufacturing steps (e.g., removal or deposition of materials), improve the scale of manufacturing, reduce variability among memory cells, etc. Further, manufacturers can minimize any impedance mismatch between a memory controller and the memory devices within a system by calibrating input/output impedances of the memory devices to accomplish data rates desired for robust system performance.

BRIEF DESCRIPTION OF THE DRAWINGS

The present disclosure will be understood more fully from the detailed description given below and from the accompanying drawings of various embodiments of the disclosure. The waveforms in the drawings are not necessarily to scale. Instead, emphasis is placed on illustrating clearly the principles of the present disclosure.

DETAILED DESCRIPTION

Semiconductor devices delivering high performance (e.g., high bandwidth, low power consumption) may include oscillators that generate clock signals to precisely control various functional circuit blocks. In some embodiments, oscillators provide clock signals to a state machine of circuitry designed to match input/output impedances (ZQ) to a specific value—e.g., during an initialization of a DRAM device. The circuitry may be referred to as a ZQ block that facilitates different combinations of circuit components (e.g., resistors, transistors, etc.) matching the specific ZQ value (e.g., calibrating the ZQ value to 240 Ohms). Moreover, the circuit components of the ZQ block may include similar structures (e.g., legs of a transistor), each having similar resistance/impedance values. Maintaining periods of the clock signals provided to the ZQ block within a specified range across various operating temperatures of the semiconductor devices would be beneficial to improve accuracies of the ZQ calibration and to provide superior noise immunity against switching of input/output pins (DQs) that may occur during the ZQ calibration.

Figure 1A:
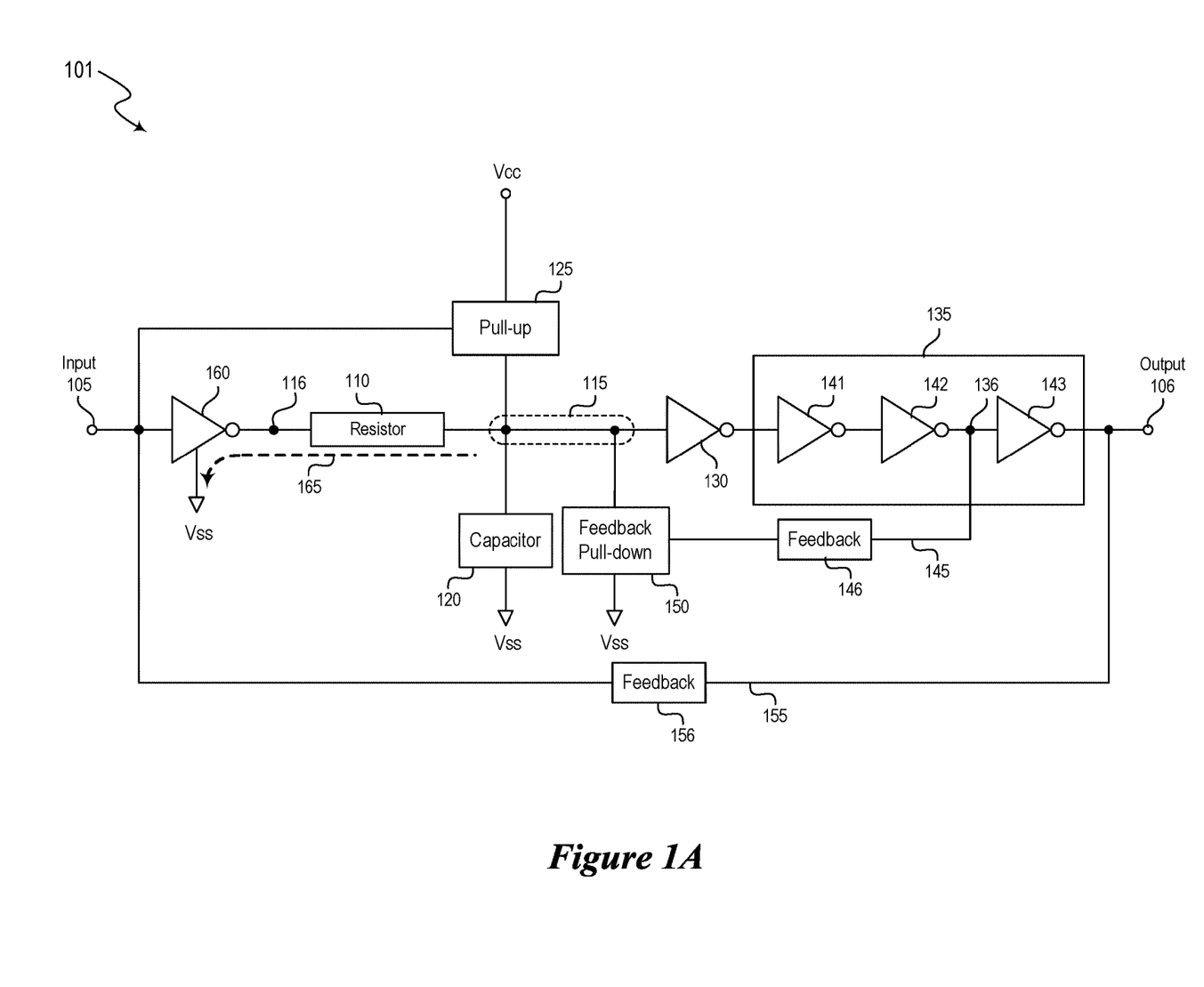
FIG. 1A is a block diagram illustrating an oscillator.
Figure 1B:
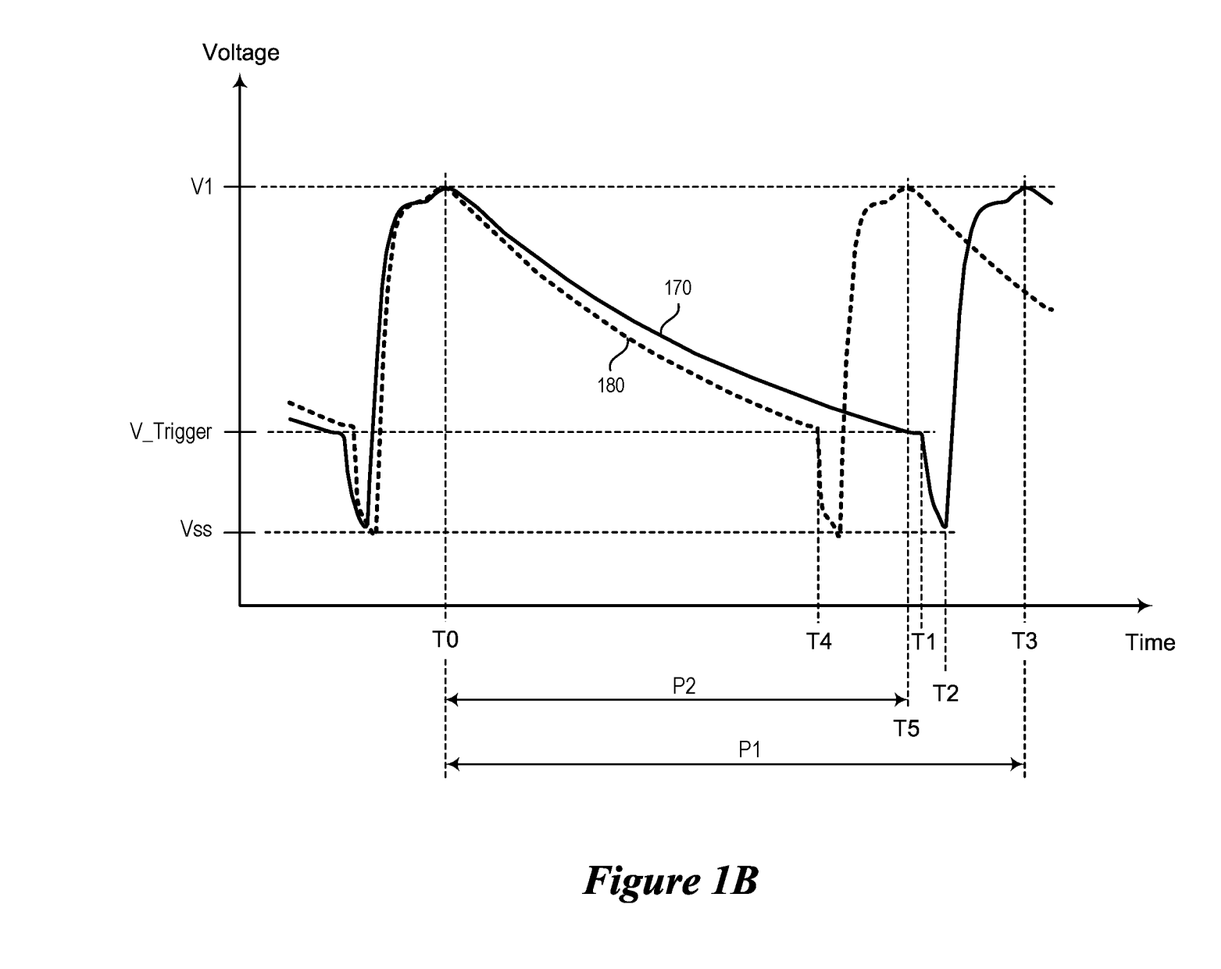
FIG. 1B illustrates waveforms of signals associated with the oscillator.

Such oscillators may include a resistor (R) and a capacitor (C) forming an RC network, a node of which can be charged to a first voltage at time T0 (e.g., the time T0 depicted in FIG. 1B). Subsequently, the node can be discharged to a second voltage at time T1 (e.g., the time T1 depicted in FIG. 1B), which in turn, would cause an inverter connected to the node to trigger (trip or reverse its output). The duration between T0 and T1 may be related to a period of the clock signal that the oscillator generates. In some embodiments, the resistor may be formed in a substrate—e.g., a silicon substrate, in which the oscillator is formed. Further, the resistor may be doped (e.g., using diffusion process steps) with various dopant species (e.g., arsenic, phosphorus, boron, indium, etc.) to achieve a desired resistance. Such resistors may be referred to as diffusion resistors. The diffusion resistors may have a positive temperature coefficient—e.g., the resistance increases as the operating temperature increases. The change in the resistance as a function of the operating temperature may result in significant variations over the specified (allowed) operating temperature range for the semiconductor devices (e.g., approximately 25% variations in certain embodiments), which in turn, would result in variations in the periods of the clock signals that the oscillator generates.

To address the foregoing challenges, embodiments of the present disclosure provide an inverter with a variable load that is configured to provide different conductance values for the inverter. For example, the variable load includes two or more branches (paths, legs) in parallel, where each branch has a unique conductance value different from each other. Further, the variable load can be coupled to a temperature sensor that generates signals based on determining (sensing) an operating temperature. The signals of the temperature sensor can be provided to the variable load of the inverter such that one or more branches of the variable load can be activated based on the operating temperature. In this manner, the variable load can have different conductance values as a function of the operating temperature such that the inverter can trigger at different voltage levels of the node. As a result of modifying the conductance value of the variable load of the inverter based on the operating temperature, variations in the period of the clock signal can be reduced.

By way of example, the oscillator may be trimmed (tuned, calibrated) to generate a clock signal with a target period during testing procedures. The testing procedures may be carried out at a specific temperature (e.g., at 90 degrees Celsius (° C.)), which may be referred to as a probe temperature. To this end, the temperature sensor may be configured to generate a first set of signals (tailored to 90°

C.±10%, 90° C.±20%, or the like) to the variable load such that the oscillator can generate the clock signal with the target period. Further, the testing procedure may assess variations in the period of the clock signal by varying the operating temperature such that the temperature sensor can be preconfigured to provide different sets of signals to the variable load at different operating temperatures in order to reduce variations in the period of the clock signal.

During the operation, if the operating temperature (e.g., 130° C.) is greater than the probe temperature, the temperature sensor provides a second set of signals (tailored to 130° C.±10%, 130° C.±20%, or the like) to the variable load such that the conductance value of the variable load may be increased to reduce deviations in the period of the clock signal with respect to the target period. Similarly, if the operating temperature (e.g., −40° C.) is less than the probe temperature, the temperature sensor provides a third set of signals (tailored to −40° C.±10%, −40° C.±20%, or the like) to the variable load such that the conductance value of the variable load may be decreased to maintain the period of the clock signal close to the target period. As such, the period of the clock signal that the oscillator generates can be maintained with a predetermined range (as required by a specification) over the allowed operating temperatures of the semiconductor devices.

FIG. 1A is a block diagram schematically illustrating an oscillator 101 of a semiconductor device (e.g., a DRAM device). In the example embodiment of FIG. 1A, the oscillator 101 includes a resistor 110, a capacitor 120, a pull-up component 125, a first inverter 130, a feedback pull-down component 150, all of which are coupled to a node 115—i.e., the node 115 is common to (shared by) the above identified components. The node 115 may be referred to as an RC node, or a discharge node. Further, the oscillator 101 includes a second inverter 160 coupled to the resistor 110, as well as an amplifier 135 coupled to the first inverter 130. The oscillator 101 has an input terminal 105 (which corresponds to the input terminal of the second inverter 160) and an output terminal 106 (which corresponds to the output terminal of the amplifier 135). Moreover, the oscillator 101 includes a first feedback loop 145 (which may include a first feedback component 146) between the amplifier 135 and the feedback pull-down component 150, and a second feedback loop 155 (which may include a second feedback component 156) between the output terminal 106 and the input terminal 105 (and the pull-up component 125).

As depicted in FIG. 1A, the resistor 110 has a first terminal connected to the node 115. In some embodiments, the resistor 110 includes a diffusion resistor. Further, the capacitor 120 is connected to the node 115. In some embodiments, the capacitor 120 includes two or more metal-oxide semiconductor field-effect transistors (which may also be referred to as MOSFETs or MOS transistors) connected in parallel with each other—e.g., p-channel MOS transistors, n-channel MOS transistors. The resistor 110 and the capacitor 120, in combination, may be regarded as an RC network of the oscillator 101.

Further, the pull-up component 125 has a first terminal connected to the node 115 and a second terminal connected to a voltage source (Vcc) having a first voltage, V1 (e.g., the voltage V1 depicted in FIG. 1B). The pull-up component 125, when activated, is configured to couple the node 115 to Vcc (e.g., at time T0 described with reference to FIG. 1B) to charge the node 115 to V1. The pull-up component 125, when deactivated, is configured to decouple (disconnect) the node 115 from Vcc—e.g., after charging the node 115 to V1. In some embodiments, the pull-up component 125 includes a p-channel MOS transistor with its gate coupled to the output terminal 106 of the oscillator 101 (through the second feedback loop 155). In this regard, the p-channel MOS transistor includes a gate coupled to an output terminal of the amplifier 135, a source coupled to the voltage source (Vcc), and a drain coupled to the node 115.

The first inverter 130 may include a complementary metal-oxide-semiconductor (CMOS) inverter having an n-channel MOS (nMOS) transistor and a p-channel MOS (pMOS) transistor. Such a CMOS inverter reverses its output in response to a voltage applied to its input. For example, if the voltage applied to its input is less than a trigger voltage of the CMOS inverter, the output of the CMOS inverter may be approximately equal to a voltage (e.g., V1) of the voltage supply (e.g., Vcc), under which the CMOS inverter operates. Similarly, if the voltage applied to its input is equal to and/or greater than the trigger voltage, the output of the CMOS inverter may be approximately equal to a ground potential (a ground, a ground level, a ground node), to which the CMOS inverter is coupled (e.g., Vss). Further, the inverters included in the oscillator 101 (e.g., the first and second inverters 130 and 160, the inverters 141-143 of the amplifier 135) may operate under the voltage supply (Vcc).

The amplifier 135 may include one or more inverters. In the example embodiment of FIG. 1A, the amplifier 135 is depicted to include three inverters, namely inverters 141, 142, and 143. Each inverter of the amplifier 135 may correspond to the CMOS inverter described herein. The amplifier 135 is coupled to the first inverter 130 to receive the output (e.g., a voltage waveform) that the first inverter 130 generates. Moreover, the amplifier 135 can be configured to refine the voltage waveform to generate the clock signal of the oscillator 101 at the output terminal 106. The output terminal 106 of the oscillator 101 (corresponding to the output terminal of the amplifier 135) may be coupled to a frequency divider (not shown) to reduce the frequency of the clock signal (to "slow down" the clock signal), prior to feeding the "slowed" clock signal to other functional blocks of the semiconductor device—e.g., the ZQ block.

In some embodiments, the feedback pull-down component 150 may include an n-channel MOS transistor with its gate coupled to one of the internal nodes of the amplifier 135 (e.g., a node 136 corresponding to the output terminal of the inverter 142). As described in more detail herein with reference to waveforms of FIG. 1B, the feedback pull-down component 150 may be configured to assist the voltage of the node 115 to reach the ground level (e.g., Vss) after the voltage of the node 115 reaches a trigger voltage of the first inverter 130 at time T1.

In some embodiments, the second inverter 160 includes the CMOS inverter described herein. The second inverter 160, when activated, may establish a leakage path 165 for the node 115. Further, the second inverter 160, when deactivated, may isolate the node 115 from the ground (e.g., Vss)—e.g., shutting the leakage path 165 while the node 115 is being charged to V1.

Aspects of the oscillator 101 operation is described herein with reference to FIG. 1B in view of various components described with reference to FIG. 1A. The waveforms and operations of various components of the oscillator 101 are described based on operating principles of digital electronic circuits and functional blocks having two distinct levels of voltages. For example, such voltages may include a "high" voltage ($V_H$) designated to a first logic state of "1" or "high" and a "low" voltage ($V_L$) designated to a second logic state of "0" or "low." The first voltage level may correspond to 0.8

V, 1.0 V, 1.2 V, or any other suitable values to adequately operate the digital electronic circuits and functional blocks. The second voltage level may correspond to a ground potential (a ground, a ground node) for the semiconductor device, typically corresponding to 0 V (or any other suitable values). Further, the oscillator 101 may include other components and/or functional blocks, which are omitted in FIG. 1A to avoid obfuscating the principles of the present disclosure. Although foregoing example circuits and functional blocks are described with two logic states or voltage levels, the present disclosure is not limited thereto. For example, the principles of the present disclosure would be applicable to circuits and functional blocks designed to operate with more than two levels of logic states or voltage levels.

FIG. 1B illustrates voltage waveforms (e.g., waveforms 170 and 180) corresponding to the voltage of the node 115 as a function of time. The waveforms 170 and 180 illustrate aspects of the oscillator 101 generating clock signals at different operating temperatures. For example, the waveform 170 corresponds to the voltage of the node 115 at a first operating temperature (e.g., a probe temperature of 90° C.). Likewise, the waveform 180 corresponds to the voltage of the node 115 at a second operating temperature, which may be less (lower) than the first temperature—e.g., a temperature corresponding to a minimum allowed operating temperature, for example, −40° C.

At time T0, the waveform 170 reaches V1 (i.e., the voltage of the node 115 is charged to V1)—e.g., by activating the pull-up component 125 that couples the node 115 to the voltage supply Vcc. As described above, the pull-up component 125 may include a pMOS transistor with its gate coupled to the output terminal 106 of the oscillator 101, which can provide $V_L$ to the gate of the pMOS transistor through the feedback loop 155 (and/or the feedback component 156). As such, the pMOS transistor of the pull-up component 125 may be activated to couple the node 115 to the voltage supply Vcc at T0. Further, the input of the second inverter 160 (e.g., a CMOS inverter) can also be provided with $V_L$ through the feedback loop 155 (and/or the feedback component 156). Accordingly, the second inverter 160 can facilitate the node 115 to be charged to V1—e.g., by shutting the discharge path 165.

Subsequently, the pull-up component 125 may decouple the node 115 from Vcc, and the voltage of the node 115 begins to decrease from V1—e.g., due to the leakage current flowing through the leakage path 165 from the node 115. In this regard, the second inverter 160 may provide the discharge path 165 available after the node 115 has been charged to V1 and/or been disconnected from Vcc. At time T1, the voltage of the node 115 reaches a trigger voltage (V_Trigger) of the first inverter 130. As described above, the first inverter 130 (e.g., a CMOS inverter) is configured to reverse its output in response to the voltage of the node 115 becoming less than the trigger voltage—e.g., $V_L$ present at the input of the first inverter 130. As a result, the output of the first inverter 130 may correspond to $V_H$, which in turn, establishes the output of the inverter 142 at the node 136 corresponding to $V_H$. As the feedback pull-down component 150 is coupled to the node 136 through the first feedback loop 145, $V_H$ at the node 136 may activate the feedback pull-down component 150 (e.g., an nMOS transistor) such that the feedback pull-down component 150 can assist the voltage of node 115 to reach Vss at time T2.

In response to the voltage of the node 115 reaching Vss at time T2, the output of the amplifier 135 (e.g., the output of the inverter 143) corresponds to $V_L$, which in turn, activates the pull-up component 125 (and causes the second inverter 160 to shut the discharge path 165). In this manner, the pull-up component 125 can charge the node 115 such that the voltage of the node 115 can reach V1 at time T3 to repeat the sequence of operations described above. As such, the oscillator 101 may have the node 115 of the RC network to periodically alternate between V1 and Vss, with a period P1 (e.g., duration between T0 and T3). The oscillator 101 may be designed (e.g., by selecting resistance and capacitance values for the RC network) to generate a clock signal with a target period at the probe temperature, which is related to the period P1.

Behavior of the RC network of the oscillator 101 (and/or the voltage of the node 115) may be characterized with a time constant (τ) related to a product of the resistance value of the resistor 110 and the capacitance value of the capacitor 120. For example, the greater the time constant t, the less the rate of voltage change of the node 115 as a function of time (which may also be referred to as dv/dt). In some embodiments, the resistance value of the resistor 110 may vary as a function of the operating temperature (e.g., having a positive temperature coefficient) resulting in the time constant τ of the RC network to vary depending on the operating temperature. For example, if the resistance value of the resistor 110 decreases as the operating temperature decreases, the time constant τ may decrease such that the rate of voltage change would increase—e.g., the RC network discharges relatively fast to reach V_Trigger from V1. Similarly, if the resistance value of the resistor 110 increases as the operating temperature increases, the time constant τ may increase such that the rate of voltage change would decrease—e.g., the RC network discharges relatively slowly to reach V_Trigger from V0.

For example, the waveform 180 illustrates the voltage at the node 115 at a second operating temperature less than the first temperature (e.g., −40° C.). At time T0, the waveform 180 reaches V1 (i.e., the voltage of the node 115 is charged to V1)—e.g., by activating the pull-up component 125 that couples the node 115 to the voltage supply Vcc. Subsequently, the voltage of the node 115 begins to decrease (discharge) from V1 toward V_Trigger—e.g., due to the leakage current flowing through the leakage path 165 from the node 115. As the resistance of the resistor 110 is reduced (i.e., the time constant τ is smaller, the dv/dt is greater), the slope of the waveform 180 is steeper than that of the waveform 170. Hence, at time T4, which is less than T1, the voltage of the node 115 reaches the trigger voltage (V_Trigger) of the first inverter 130. Thereafter, the voltage of the node 115 reaches Vss (e.g., through the feedback pull-down component 150), and then re-charges to V1 at time T5. As such, the oscillator 101 may have the node 115 of the RC network to periodically alternate between V1 and Vss, with a period P2 (e.g., duration between T0 and T5) that is less than the period P1.

Accordingly, the oscillator 101 may generate a clock signal with a shorter period than the target period if operating at a lower temperature than the probe temperature. Similarly, the oscillator 101 may generate a clock signal with a longer period than the target period if operating at a higher temperature than the probe temperature. Such variations in the period of the clock signal that the oscillator 101 generates may be disadvantageous for functional blocks (e.g., ZQ blocks) to perform accurately based on receiving the clock signal from the oscillator 101.

Figure 2:
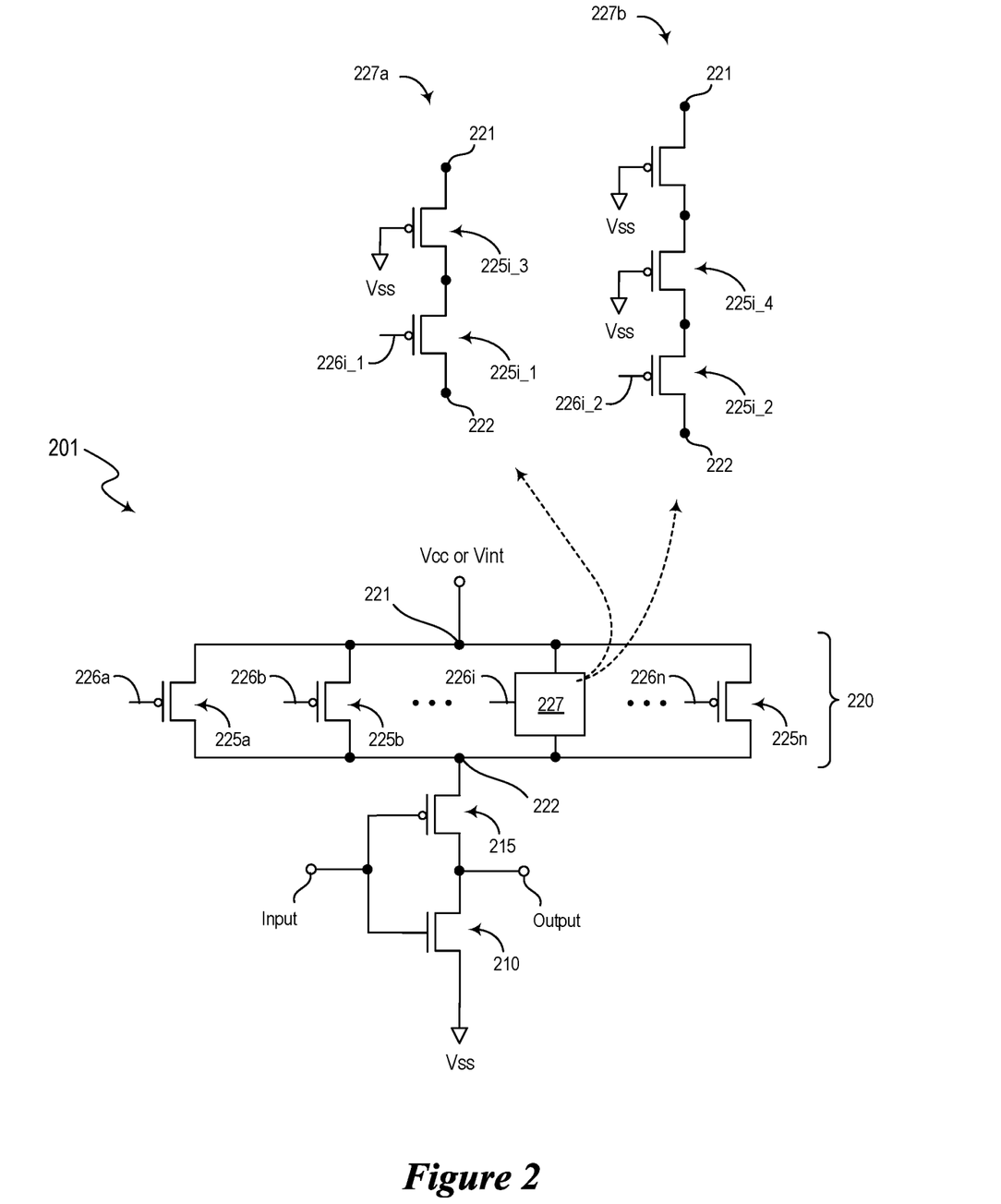
FIG. 2 is a circuit diagram of an inverter in accordance with embodiments of the present disclosure.

FIG. 2 is a circuit diagram of an inverter 201 in accordance with embodiments of the present disclosure. The inverter 201 includes an nMOS transistor 210 and a pMOS transistor 215 connected to the nMOS transistor at an output terminal of the inverter 201. Gates of the nMOS transistor 210 and the pMOS transistor 215 are connected to form an input terminal of the inverter 201. Further, the inverter 201 includes a variable load 220 including a first terminal 221 connected to a voltage source (e.g., Vint in FIG. 3A) and a second terminal 222 connected to the pMOS transistor 215. The variable load 220 may be configured to provide two or more conductance values for the inverter 201 as a function of an operating temperature of the inverter 201.

In some embodiments, the variable load 220 includes a set of conductive paths (branches), each one of the conductive paths disposed between the first and second terminals 221 and 222. Further, individual conductive paths of the variable load 220 are coupled to corresponding terminals of a temperature sensor configured to sense an operating temperature of the inverter 201 (or the oscillator 301 including the inverter 201). The temperature sensor may generate signals to activate one or more conductive paths of the variable load 220 in response to sensing the operating temperature of the inverter 201. Moreover, the individual conductive paths may have different conductance values from each other. In some embodiments, the variable load 220 includes a plurality of MOS transistors (e.g., pMOS transistors 225a/b/n as depicted in FIG. 2) disposed between the first and second terminals 221 and 222. Further, gates of the MOS transistors (e.g., gates 226 of the pMOS transistors) are coupled to corresponding output terminals of the temperature sensor. As such, the temperature sensor can activate one or more MOS transistors of the variable load 220 in response to sensing the operating temperature of the inverter 201.

The MOS transistors (e.g., pMOS transistors) of the variable load 220 may be configured to have different sizes (e.g., channel lengths (L) and/or channel widths (W)) that determines different conductance values of the MOS transistors. For example, the pMOS transistor 225a has W equal to 1.76 micro meters (μm) and L equal to 1 μm, and the pMOS transistor 225b has W equal to 0.11 μm and L equal to 8 μm. In other words, the pMOS transistor 225a has a greater conductance than the pMOS transistor 225b. In some embodiments, a conductive path of the variable load 220 includes a single MOS transistor (e.g., the pMOS transistors 225a/b/n). Although, FIG. 2 depicts the variable load 220 to include pMOS transistors, the present disclosure is not limited thereto. For example, the variable load 220 may include nMOS transistors, bipolar junction transistors (BJTs), junction field effect transistors (JFETs), or other suitable components that can be activated or deactivated to provide different conductance values of the variable load 220.

In some embodiments, a conductive path of the variable load 220 includes two or more MOS transistors that are serially connected to each other between the first and second terminals 221 and 222—e.g., a conductive path 227. Such a conductive path may have different configurations of the two or more MOS transistors as shown in the example conductive paths 227a and/or 227b. Further, at least one MOS transistor (e.g., the pMOS transistors 225i_1, 225i_2) of the two or more MOS transistors has a gate (e.g., the gate 226i_1 or 226i_2 of the pMOS transistor 225i_1 or the pMOS transistor 225i_2) coupled to an output terminal of the temperature sensor. Moreover, at least one MOS transistor of the two or more MOS transistors may be configured to be always conductive during operation—e.g., the pMOS transistor 225i_3 with its gate connected to Vss (or a ground node), the pMOS transistor 225i_4 with its gate connected to Vss (or a ground node).

As described in more detail with reference to FIG. 3B, the inverter 201 having the variable load 220 can compensate the variations in the time constant (t) of the RC network of the oscillator 101. For example, if the resistor 110 has a positive temperature coefficient, at a relatively low operating temperatures (e.g., −40° C.), the temperature sensor may decrease the conductance of the variable load 220—e.g., activating the pMOS transistor 225b (and deactivating the pMOS transistor 225a, in some cases). In this manner, the inverter 201 may trigger (e.g., reverses its output) at a relatively lower trigger voltage to compensate the reduction in the clock signal period (e.g., P2 at a lower temperature being less than P1 at a higher temperature as shown in FIG. 1B). Similarly, at a relatively high operating temperatures (e.g., 130° C.), the temperature sensor may increase the conductance of the variable load 220—e.g., activating the pMOS transistor 225a (and deactivating the pMOS transistor 225b, in some cases) such that the inverter 201 may trigger (e.g., reverses its output) at a relatively high trigger voltage.

The temperature sensor may be configured to generate signals to activate (or deactivate) one or more conductive paths of the variable load 220. By way of example, if the variable load 220 has eight (8) conductive paths, the temperature sensor may generate different combinations of signals (e.g., up to 255 combinations if necessary, in view of the 256 ($2^8$) theoretically possible distinct combinations), where each combination of signals causes the variable load 220 to provide a distinct conductance value for the inverter 201. As such, the oscillator 101 may be characterized (e.g., during probe procedure and/or test procedure) to assess ranges of the clock signal frequencies that the oscillator 101 may generate as a function of the operating temperature, and the temperature sensor may be preconfigured to generate certain combinations of signals corresponding to sub-ranges of the operating temperature (e.g., −40° C.±10%, −10° C.±10%, 20° C.±10%, 90° C.±10%, 100° C.±10%, 130° C.±10%, etc.) such that the oscillator 101 can generate clock signals having frequencies within a predetermined range across the entire operating temperature range, despite variations in the operating temperatures.

Figure 3A:
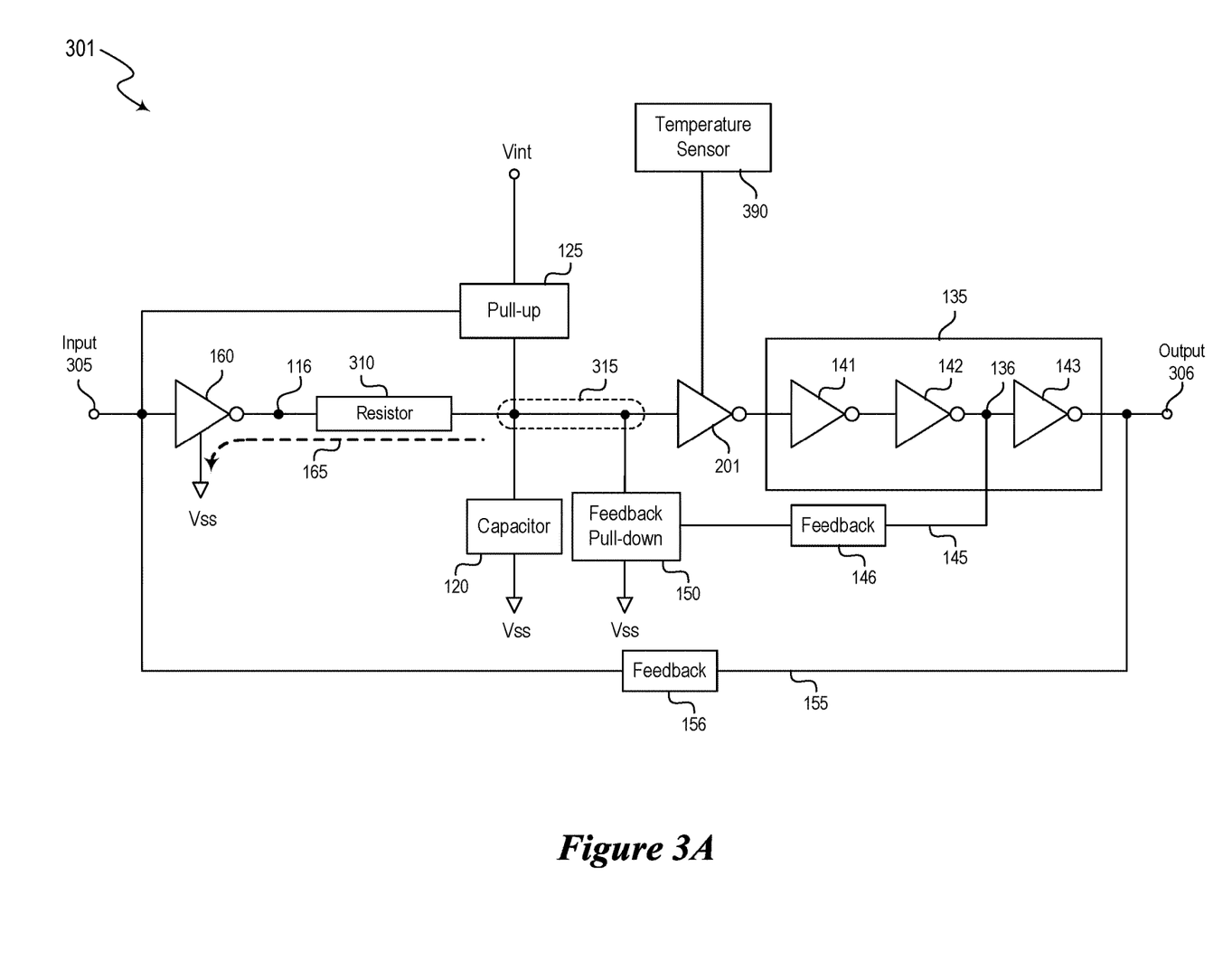
FIG. 3A is a block diagram of an oscillator in accordance with embodiments of the present disclosure.

FIG. 3A is a block diagram schematically illustrating an oscillator 301 of a semiconductor device (e.g., a DRAM device) in accordance with embodiments of the present disclosure. The oscillator 301 may include aspects of the oscillator 101 described with reference to FIG. 1A. For example, the oscillator 301 includes the capacitor 120, the pull-up component 125, the feedback pull-down component 150, the second inverter 160, and the amplifier 135. Moreover, the oscillator 301 includes the first feedback loop 145 (which may include the first feedback component 146) between the amplifier 135 and the feedback pull-down component 150, as well as the second feedback loop 155 (which may include the second feedback component 156). Further, the oscillator 301 includes the inverter 201 coupled to a temperature sensor 390 (which may be external to the oscillator 301 in some cases) as described with reference to FIG. 2, and a resistor 310. Further, FIG. 3A depicts a voltage supply Vint configured to couple with the pull-up component 125, which may be an internally generated and/or regulated power supply. Further, the inverters included in the oscillator 301 (e.g., the inverter 201 with the variable load 220, the second inverter 160, the inverters 141-143 of the amplifier 135) may operate under Vint.

Figure 3B:
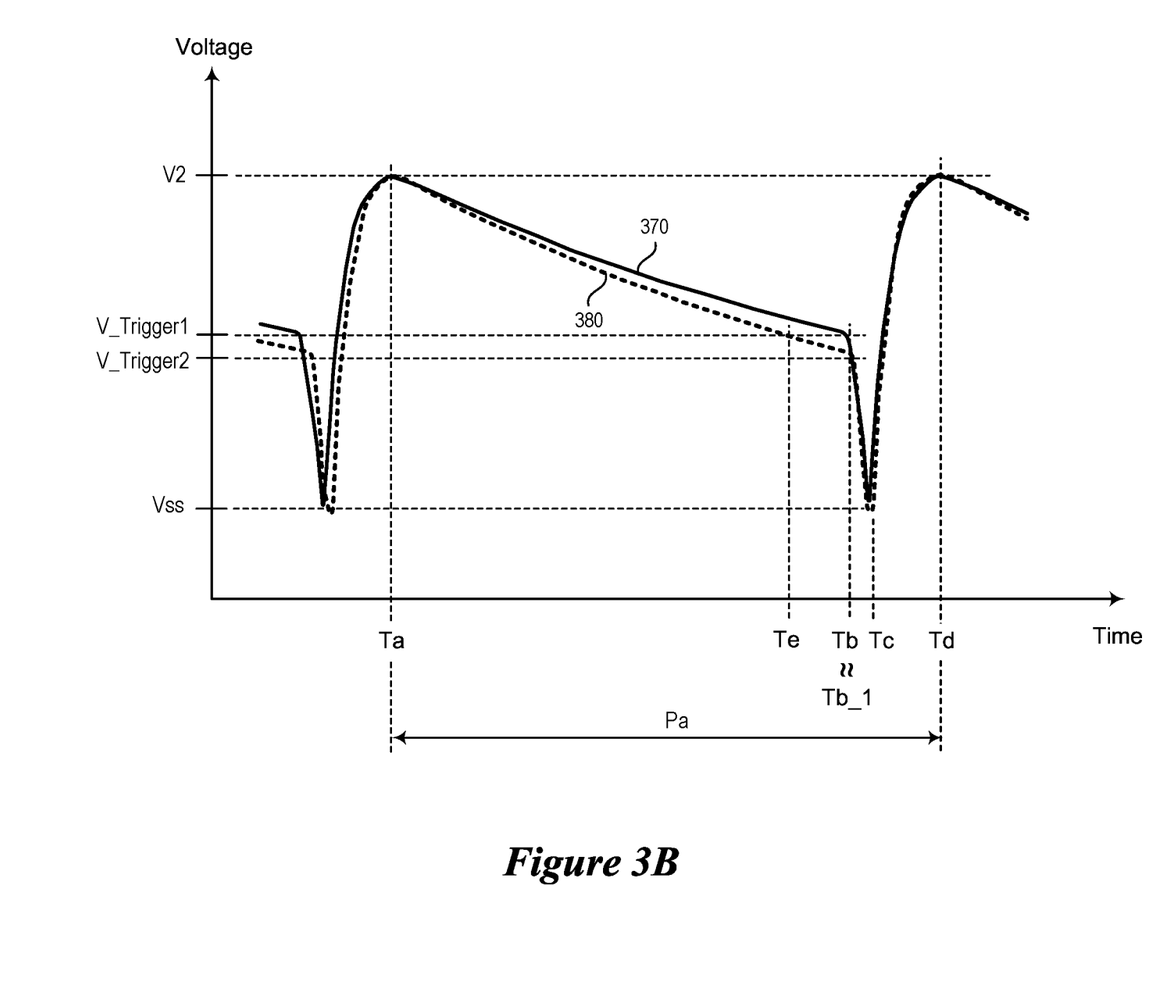
FIG. 3B illustrates waveforms of signals associated with the oscillator.

FIG. 3B illustrates voltage waveforms (e.g., waveforms 370 and 380) as a function of time, which correspond to a voltage of the node 315 of the oscillator 301. For example, the waveform 370 corresponds to the voltage of the node 315 at a first operating temperature (e.g., a probe temperature at 90° C.). Likewise, the waveform 380 corresponds to the voltage of the node 315 at a second operating temperature, which may be less (lower) than the first temperature (e.g., a temperature corresponding to a minimum allowed operating temperature, for example, −40° C.).

The oscillator 301 may operate similarly to the oscillator 101 as described with reference to FIGS. 1A and 1B. For example, the waveform 370 (e.g., at a probe temperature 90° C.) illustrates that at time Ta, the node 315 may be coupled to Vint to reach (e.g., charged) to a second voltage V2 of Vint. At time Tb, after having been discharged through the discharge path 165, the voltage of the node 315 reaches a first trigger voltage (V_Trigger1) of the inverter 201. Subsequently, at time Tc, the waveform 370 depicts the voltage of the node 315 corresponding to Vss (e.g., through the feedback pull-down component 150). Thereafter, at time Td, the voltage of the node 315 is charged to V2 to repeat the operating sequence generating the clock signal at the output terminal 306, namely having the voltage of the node 315 to periodically alternate between V2 and Vss, with a period Pa (e.g., duration between Ta and Td) at the first operating temperature (e.g., at a probe temperature 90° C.).

As described herein, during the probe procedure, the temperature sensor 390 can be preconfigured to activate one or more conductive paths of the variable load 220 such that the period Pa is optimized (tailored, tuned) for the oscillator 301 to generate the clock signal with the target period (e.g., a target frequency) at the output terminal 306. Moreover, the temperature sensor 390 can be preconfigured to activate different combinations of the conductive paths of the variable load 220 in response to determining the operating temperatures for the oscillator 301 such that the clock frequencies that oscillator 301 generates can be maintained within a predetermined range across the operating temperatures (e.g., between −40° C. to 130° C.) of the semiconductor device.

For example, if the oscillator 301 operates at the second temperature less than the first temperature (e.g., at −40° C.), the time constant of the RC network may decrease as a result of the reduced resistance of the resistor 310 at the second temperature—e.g., when compared to the time constant at the probe temperature of 90° C. As such, the rate of voltage change of the node 315 is increased (i.e., dv/dt at −40° C. is greater than that at 90° C.). If the inverter 201 operates with the same trigger voltage (V_trigger1) as in the first temperature, the inverter 201 would have triggered at time Te, which in turn, would result in a reduced period of the clock signal that oscillator 301 generates. The temperature sensor 390, however, can reduce the conductance value of the variable load 220 in response to sensing the second temperature by generating a different set of signals to the variable load 220 (to activate a different set of paths of the variable load 220 to reduce the conductance value).

As a result, the inverter 201 operates with a different trigger voltage (e.g., V_trigger2, which is less than V_trigger1) at the second temperature. The change in the trigger voltage extends (prolongs) the time for the inverter 201 to trigger (reverses its output)—e.g., from Te to Tb (or Tb_1 approximately same as Tb, within ±3%, ±5%, ±10%, or the like). Similarly, the inverter 201 may operates with yet another trigger voltage (e.g., V_trigger3, not shown, which may be greater than V_trigger1) at a third temperature greater than the first temperature to compensate for the increase in the time constant (i.e., a reduced dv/dt). In this manner, the oscillator 301 can maintain the frequencies of the clock signals it generates within a predetermined range across the operating temperatures (e.g., between −40° C. to 130° C.) of the semiconductor device.

In some embodiments, variations in voltage levels of the voltage supply (e.g., Vcc depicted in FIG. 1A) cause variations in the clock signal that the oscillator (e.g., the oscillator 101) generates. For example, variations in Vcc (e.g., an external voltage supply) may result in changes in the trigger voltage (V_trigger) of the inverter 130, which in turn, would result in variations in the frequency of the clock signal. As depicted in FIG. 3A, the oscillator 301 includes Vint (e.g., an internally generated and/or regulated voltage supply) such that the variations in Vint would be reduced than that of an external voltage supply (e.g., Vcc of the oscillator 101). In this manner, the oscillator 301 can generate clock signals that are less prone to variations in the voltage levels of the voltage supply.

In some embodiments, variations in the fabrication process cause variations in the clock signal that the oscillator (e.g., the oscillator 101) generates. For example, variations in patterning process (e.g., photolithography process, etch process, etc.) may result in variations in physical dimensions (e.g., length, width) of the resistor (e.g., the resistor 110) of the RC network. The resistor 310 included in the oscillator 301 may be configured to compensate for such process variations as described in more detail with reference to FIG. 4.

Figure 4:
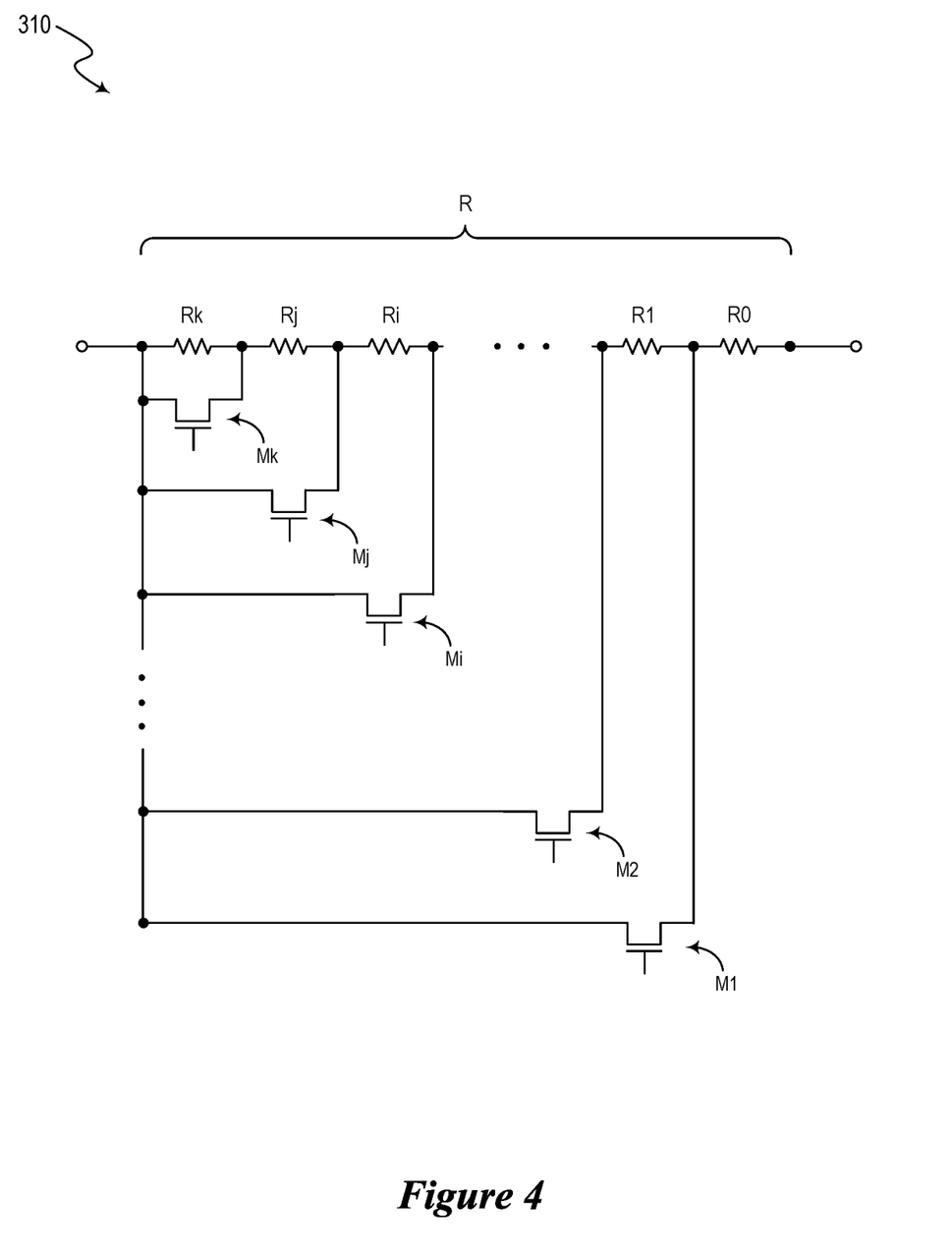
FIG. 4 is a circuit diagram of a resistor in accordance with embodiments of the present disclosure.

FIG. 4 is a circuit diagram of the resistor 310 in accordance with embodiments of the present disclosure. The resistor 310 includes a set of sub-resistors (R0, R1, through Rk) connected in series. Further, certain sub-resistors (e.g., R1 through Rk) are coupled to corresponding MOS transistors (e.g., M1 M2, through Mk) that are configured to electrically bypass (e.g., shunt) one or more sub-resistors of the set, if activated. For example, if none of the MOS transistors are activated, the resistor 310 would have a resistance R corresponding to R0+R1+ . . . +Rk. However, if M1 is activated, the resistor 310 would have R corresponding to R0. Further, if Mj is activated, the resistor 310 would have R corresponding to R0+R1+ . . . +Ri. Further, the increase (or decrease) in the resistance value (ΔR) as one or more sub-resistors are activated (or deactivated) can be maintained to be approximately constant such that the resistor 310 may have a range of resistance with approximately linear incremental (or decremental) steps. In this manner, during the probe procedure, the resistor 310 can be optimized (tuned, tailored) to compensate for the process variations (i.e., at least the variations in the resistance value stemming therefrom) by determining which MOS transistor to activate.

Figure 5:
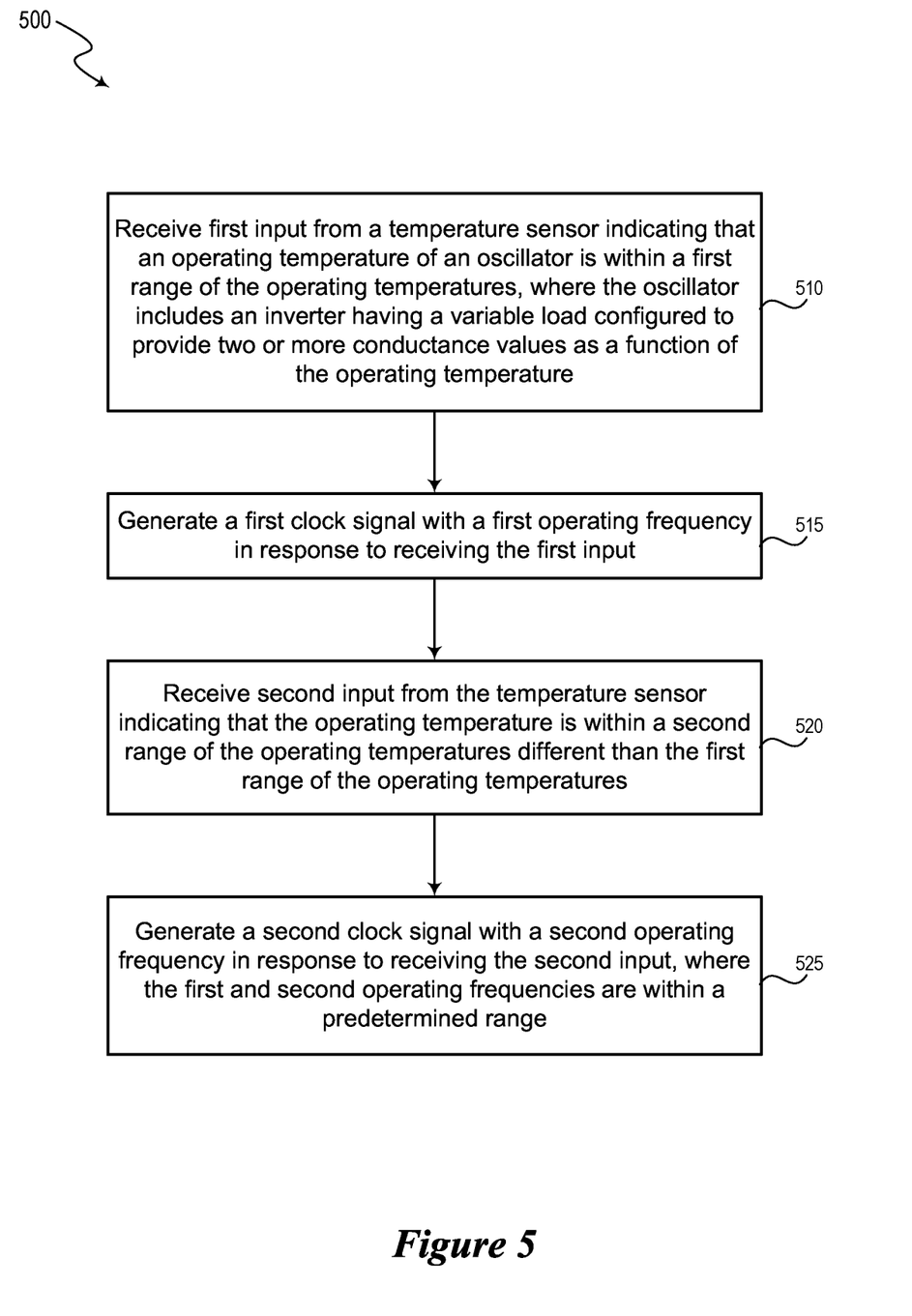
FIG. 5 is a flowchart illustrating a method of operating an oscillator in accordance with embodiments of the present disclosure.

FIG. 5 is a flowchart 500 illustrating a method of operating an oscillator in accordance with embodiments of the present disclosure. The flowchart 500 may be an example of or include aspects of a method that an oscillator (e.g., the oscillator 301) may perform as described with reference to FIGS. 1A through 4.

The method includes receiving first input from a temperature sensor indicating that an operating temperature of an oscillator is within a first range of the operating temperatures, where the oscillator includes an inverter having a variable load configured to provide two or more conductance values as a function of the operating temperature (box 510). In accordance with one aspect of the present technology, the receiving feature of box 510 can be performed by the oscillator, as described with reference to FIGS. 1A through 4.

The method further includes generating a first clock signal with a first operating frequency in response to receiving the first input (box 515). In accordance with one aspect of the present technology, the receiving feature of box 515 can be performed by the oscillator, as described with reference to FIGS. 1A through 4.

The method further includes receiving second input from the temperature sensor indicating that the operating temperature is within a second range of the operating temperatures different than the first range of the operating temperatures (box 520). In accordance with one aspect of the present technology, the receiving feature of box 520 can be performed by the oscillator, as described with reference to FIGS. 1A through 4.

The method further includes generating a second clock signal with a second operating frequency in response to receiving the second input, where the first and second operating frequencies are within a predetermined range (box 525). In accordance with one aspect of the present technology, the receiving feature of box 525 can be performed by the oscillator, as described with reference to FIGS. 1A through 4.

In some embodiments, generating the second clock signal with the second operating frequency includes decreasing the conductance value of the variable load if the second range of the operating temperatures is lower than the first range of the operating temperatures, or increasing the conductance value of the variable load if the second range of the operating temperatures is higher than the first range of the operating temperatures. In some embodiments, the variable load includes a first p-channel metal-oxide semiconductor (pMOS) transistor with a first size and a second pMOS transistor with a second size greater than the first size, and generating the second clock signal with the second operating frequency includes activating the first pMOS transistor if the second range of the operating temperatures is lower than the first range of the operating temperatures, or activating the second pMOS transistor if the second range of the operating temperatures is higher than the first range of the operating temperatures.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense. For example, the example resistors included in the oscillators (e.g., the oscillator 101, the oscillator 301) have been described to have a positive temperature coefficient, but the present disclosure is not limited thereto. In other embodiments, the resistors may have a negative temperature coefficient. Additionally, or alternatively, the capacitance value of the capacitor (e.g., the capacitor 120) may have significant variability as a function of the operating temperature. In such embodiments, the RC network may behave differently as the operating temperature varies than the foregoing descriptions and illustrations of the present disclosure. Nonetheless, the oscillator and/or the variable load of the inverter 201 (in conjunction with the temperature sensor determining the conductance values of the variable load) may be trained and optimized during the probe procedure such that the oscillator can maintain the frequencies of the clock signals it generates within a predetermined range, across the operating temperatures (e.g., between −40° C. to 130° C.) of the semiconductor device.

Those skilled in the art will appreciate that the components, blocks, and steps illustrated in FIGS. 1A through 5 described above, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

Reference in this specification to "implementations" (e.g. "some implementations," "various implementations," "one implementation," "an implementation," "some embodiments," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. An inverter, comprising:
   an input terminal;
   an output terminal;
   an n-channel metal-oxide semiconductor (nMOS) transistor;
   a p-channel metal-oxide semiconductor (pMOS) transistor connected to the nMOS transistor at the output terminal; and
   a variable load including a first terminal connected to a voltage source and a second terminal connected to the pMOS transistor, the variable load configured to provide two or more conductance values as a function of an operating temperature of the inverter,
   wherein the input terminal is configured to couple to a node of a resistor-capacitor (RC) network,
   wherein the inverter reverses its output in response to a voltage of the node being less than a first trigger voltage of the inverter when the operating temperature is within a first range of the operating temperatures; and
   wherein the inverter reverses its output in response to the voltage of the node being less than a second trigger voltage of the inverter when the operating temperature is within a second range of the operating temperatures.

2. The inverter of claim 1, wherein:
   the first trigger voltage is less than the second trigger voltage; and
   the first range of the operating temperatures is lower than the second range of the operating temperatures.

3. The inverter of claim 1, wherein the variable load has a first conductance value corresponding to the first range of the operating temperatures and a second conductance value corresponding to the second range of the operating temperatures, the first conductance value less than the second conductance value.

4. The inverter of claim 1, wherein:
   the voltage of the node becoming less than the first trigger voltage after first duration since the node has been charged to a first voltage; and
   the voltage of the node becoming less than the second trigger voltage after second duration since the node has been charged to the first voltage, the first and second duration being within a predetermined range.

5. The inverter of claim 1, wherein the variable load includes a plurality of conductive paths, each one of the conductive paths disposed between the first and second terminals, and wherein:
   individual conductive paths of the plurality are coupled to corresponding terminals of a temperature sensor configured to sense the operating temperature, and to activate one or more conductive paths of the plurality in response to sensing the operating temperature; and
   the individual conductive paths of the plurality have different conductance values from each other.

6. The inverter of claim 5, wherein:
   a first conductive path of the plurality includes a first MOS transistor; and
   a second conductive path of the plurality includes a second MOS transistor, the first and second MOS transistors having channel widths and/or lengths that are different from each other.

7. The inverter of claim 1, wherein the variable load includes an MOS transistor between the first and second terminals, a gate of the MOS transistor coupled to an output terminal of a temperature sensor configured to sense the operating temperature.

8. The inverter of claim 1, wherein the variable load includes two or more MOS transistors that are serially connected to each other between the first and second terminals, at least one MOS transistor of the two or more MOS transistors has a gate coupled to an output terminal of a temperature sensor configured to sense the operating temperature.

9. The inverter of claim 1, wherein the variable load includes two or more MOS transistors that are serially connected to each other between the first and second terminals, at least one MOS transistor of the two or more MOS transistors configured to be always conductive.

10. An oscillator, comprising:
a resistor having a first terminal connected to a node;
a capacitor connected to the node;
a pull-up component having a first terminal connected to the node and a second terminal connected to a voltage source; and
a first inverter having an input terminal coupled to the node and an output terminal coupled to an amplifier, the first inverter including a variable load configured to provide two or more conductance values as a function of an operating temperature of the oscillator.

11. The oscillator of claim 10, wherein the resistor includes a plurality of sub-resistors connected in series, and wherein at least one sub-resistor of the plurality is coupled to a metal-oxide semiconductor (MOS) transistor configured to electrically bypass one or more sub-resistors of the plurality, if activated.

12. The oscillator of claim 10, wherein:
the capacitor corresponds to a plurality of metal-oxide semiconductor (MOS) transistors connected in parallel with each other; and
the pull-up component corresponds to a p-channel MOS transistor.

13. The oscillator of claim 10, further comprising:
a second inverter having an output terminal coupled to a second terminal of the resistor, the second inverter configured to form a discharge path for a resistor-capacitor (RC) network including the resistor and the capacitor.

14. The oscillator of claim 10, wherein the amplifier includes:
one or more inverters connected in series; and
a first feedback loop coupled to a feedback pull-down component connected to the node, the feedback pull-down component configured to couple the node to a ground of the oscillator, if activated by the amplifier through the first feedback loop.

15. The oscillator of claim 14, wherein the amplifier further includes a second feedback loop coupled to:
the pull-up component; and
an input terminal of the oscillator coupled to a second inverter disposed between the input terminal of the oscillator and a second terminal of the resistor.

16. The oscillator of claim 10, wherein the pull-up component includes a p-channel metal-oxide semiconductor (pMOS) transistor with a gate coupled to an output terminal of the amplifier, a source coupled to the voltage source, and a drain coupled to the node.

17. A method, comprising:
receiving first input from a temperature sensor indicating that an operating temperature of an oscillator is within a first range of the operating temperatures, wherein the oscillator includes an inverter having a variable load configured to provide two or more conductance values as a function of the operating temperature;
generating a first clock signal with a first operating frequency in response to receiving the first input;
receiving second input from the temperature sensor indicating that the operating temperature is within a second range of the operating temperatures different than the first range of the operating temperatures; and
generating a second clock signal with a second operating frequency in response to receiving the second input, wherein the first and second operating frequencies are within a predetermined range.

18. The method of claim 17, wherein generating the second clock signal with the second operating frequency includes:
decreasing the conductance value of the variable load if the second range of the operating temperatures is lower than the first range of the operating temperatures; or
increasing the conductance value of the variable load if the second range of the operating temperatures is higher than the first range of the operating temperatures.

19. The method of claim 17, wherein the variable load includes a first p-channel metal-oxide semiconductor (pMOS) transistor with a first size and a second pMOS transistor with a second size greater than the first size, and wherein generating the second clock signal with the second operating frequency includes:
activating the first pMOS transistor if the second range of the operating temperatures is lower than the first range of the operating temperatures; or
activating the second pMOS transistor if the second range of the operating temperatures is higher than the first range of the operating temperatures.

\* \* \* \* \*